(12) United States Patent  (10) Patent No.: US 7,954,384 B2
Koehler et al.  (45) Date of Patent: Jun. 7, 2011

(54) PRESSURE SENSOR AND MANUFACTURING METHOD OF THE SAME

(75) Inventors: Jens Koehler, Thiendorf (DE); Wilhelm Prinz Von Hessen, Radebeul (DE)

(73) Assignee: Silicon Micro Sensors GmbH, Dresden (DE)

( * ) Notice: Subject to any disclaimer, the term of this patent is extended or adjusted under 35 U.S.C. 154(b) by 93 days.

(21) Appl. No.: 12/553,163

(22) Filed: Sep. 3, 2009

(65) Prior Publication Data

US 2010/0089169 A1   Apr. 15, 2010

(30) Foreign Application Priority Data

Sep. 3, 2008 (DE) .................. 20 2008 011 684 U

(51) Int. Cl.
*G01L 7/00* (2006.01)
(52) U.S. Cl. ......................................... 73/756
(58) Field of Classification Search ........................ None
See application file for complete search history.

(56) References Cited

U.S. PATENT DOCUMENTS

| 7,024,937 | B2 | 4/2006 | James | |
| 2005/0210990 | A1* | 9/2005 | Hayashi et al. | 73/708 |
| 2005/0229708 | A1* | 10/2005 | Nomura | 73/708 |
| 2007/0193359 | A1* | 8/2007 | Asada et al. | 73/754 |
| 2008/0190209 | A1* | 8/2008 | Baba | 73/754 |
| 2008/0202250 | A1* | 8/2008 | Koehler et al. | 73/756 |
| 2008/0030524 | A1 | 12/2008 | Von Klopmann et al. | |

FOREIGN PATENT DOCUMENTS

DE   10260105 A1   7/2004
EP   1785710 A2   5/2007

* cited by examiner

*Primary Examiner* — Andre J Allen
(74) *Attorney, Agent, or Firm* — Heslin Rosenberg Farley & Mesiti P.C.

(57) ABSTRACT

A pressure sensor comprises a housing, a housing plug and a pressure port, which projects into the housing. The pressure sensor has a pressure-sensing element adhesively cemented on the pressure port, so that a passage, located in the pressure port, is sealed. To produce an adhesive film between the pressure port and the housing, the pressure port or the housing or both exhibit a recess in a region, which borders at least section by section on the adhesive film. The volume of recess is equal to the volume of the adhesive film. To produce the adhesive film, the intermediate space between the pressure port and the housing is filled with the adhesive, which was introduced into the recess, while utilizing a capillary effect.

14 Claims, 3 Drawing Sheets

PRESSURE SENSOR AND MANUFACTURING METHOD OF THE SAME

CROSS REFERENCE TO RELATED APPLICATIONS

This application claims priority of German application No. 20 2008 011 684.8, filed on Sep. 3, 2008, the entire disclosure of these applications being hereby incorporated herein by reference.

BACKGROUND ART

Provided is a pressure sensor, which comprises a housing with a pressure port projecting into the housing and which is equipped with a micro-mechanical pressure sensing element that is arranged in the housing. The pressure sensing element is connected to the pressure port in such a manner that it seals a passage of the pressure port, by way of which a pressure acts directly on the pressure sensing element. In addition, a method for manufacturing such a pressure sensor is provided.

Such pressure sensors are used for monitoring the pressure or the pressure fluctuations in various fields of applications exhibiting widely varying pressure ranges. For example, in control units for piston motors or in piston compressors the requirements with respect to the pressure stability, the temperature range and the service life are very stringent. In particular, under very high and to some extent sudden pressure fluctuations and the maximum pressures, which may occur there, the reliability of the pressure loaded connections, which are often designed as cemented joints, must be guaranteed under all operating conditions.

A typical design of a pressure sensor is described, for example, in U.S. Pat. No. 7,024,937 B2. A pressure-sensing element is mounted with its diaphragm over the passage of a pressure port, so that a pressure, which is applied in the passage of the pressure port and is supposed to be measured, acts on the diaphragm. The opposite side of the diaphragm, which is often called (as also below) the front side of the pressure-sensing element, has measurement resistors, by means of which the change in the resistance of the applied pressure or a fluctuation in the pressure is supposed to be determined. The resistance fluctuation results, as known in the prior art, from a deflection of the diaphragm from its quiescent position as a consequence of a change in the applied pressure and the associated tensile load or pressure load on the diaphragm. The pressure sensing element and the pressure port, including the necessary electronics, are mounted in a housing in that the pressure port is adhesively cemented to the housing. A comparable pressure sensor is also described in DE 102 60 105 A1. However, the description in that document does not relate to a surrounding housing.

When pressure is applied, the connection of the pressure-sensing element on the pressure port and similarly also the connections between the pressure port and the housing are under high tension. This tension leads, especially at high pressure and long-term usage of the pressure sensor, to reliability problems. The reliability problems are aggravated by bubbles or channels or the like in the cemented joints, all of which impair the pressure tightness and can cause the connection to detach at least in some places.

These problems increase with the statutory requirement stipulating the use of lead-free materials, since it is possible only with difficulty to produce with respect to the pressure and the temperature reliable cemented joints between the lead-free components of a pressure sensor, as described, for example, in EP 1 785 710 A2, or to produce reliable cemented joints, which are made of other materials that are capable of withstanding higher chemical and mechanical stresses, over the entire field of application.

Therefore, the object of the invention is to provide a pressure sensor that exhibits tight and durable cemented joints even at high pressures and pressure differentials while simultaneously using lead-free materials.

BRIEF SUMMARY OF INVENTION

The described pressure sensor makes it possible to produce pressure-loaded cemented joints of the individual components of the pressure sensor without voids and without shrink holes so that said cemented joints are capable of withstanding pressures of up to 40 bar operating pressure and, in addition, exhibit the mandatory reliability. In particular, the connection, which is produced in this way, between the housing and the pressure port has proven to be reliable. For the sake of completeness, in corresponding embodiments of the pressure sensor, additional connections of the pressure port with additional components of the pressure sensor can be produced in the described way, such as the connection of the pressure port with a base, on which the pressure-sensing element is mounted. When components are described below in a general way, the reference is always to those components of the pressure sensor that are connected by means of a cemented joint—that is, both the pressure port and the housing and additional components of the pressure sensor.

In addition to the pressure stability, the described cemented joints have proven to be stable over a wide temperature range and also at high cyclic temperature stresses. Hence, operating temperatures in a range of −40° C. to 135° C. and storage temperatures of up to 150° C. are possible without causing damage to the cemented joints.

In order to produce the described pressure sensor, one of the two components to be connected—that is, either the pressure port or the housing or both—comprises a recess, which holds, as the reservoir, the adhesive substance that is necessary for producing the adhesive film between the two components. In order to guarantee a defined distribution of the adhesive substance between the two components and a complete filling of the intermediate space with adhesive, the volume of the recess is adapted precisely to the volume of the adhesive film to be produced. As a result, seals of the adhesive film—such as a meniscus or a bead for instance—can be achieved by suitably dimensioning the recess.

Since the recess is positioned directly adjacent to the adhesive film, it is possible for the production of the adhesive film to utilize the capillary effect of the small intermediate space between the components that are to be adhesively cemented together. Owing to the capillary effect the recess can border on the adhesive film with its entire periphery or also just section by section.

A recess in the context used here means a space that is intended for holding the adhesive substance that is needed for producing the adhesive film. Which ones of the components that are to be connected together the recess alone exhibits or whether the recess is formed by the structure of the two components positioned in relation to each other or whether the recess is formed just section by section depends on different conditions. Hence, the shape of the pressure port or the housing or the additional component has an influence on whether a recess can be formed directly adjacent to the adhesive film. Moreover, the required quantity of adhesive and, thus, the required size of the recess or the material of the components have an influence on the spatial structure of the recess.

In order to produce the adhesive connection between the pressure port and the housing and in a comparable manner also between the pressure port and an additional component, the surfaces that are to be adhesively cemented together and of which at least one surface borders directly on the above-described recess, are set apart from each other at such a small distance that the intermediate space between the two components acts as a capillary on the adhesive that is applied in a liquid or liquefied state in the recess.

Capillary is defined here in the general context as a cavity, the walls of which are situated opposite each other in very close proximity. The adjustable distance between those sections of the surface of the components that form the capillary depends substantially on the surface tension of the liquid adhesive and on the contact angle between the adhesive and the surface, on which the adhesive rests, and, thus, on the materials of the components and the adhesive substance and their mutual wetting power.

Since the position of the adhesive reservoir borders directly on the intermediate space, the capillary effect causes the adhesive to fill the intermediate space, so that after the adhesive cures, the adhesive film is produced between both components. To the extent that it appears to be advantageous for the initial comprehensive distribution of the adhesive—for example, in the case of section-by-section reservoirs—or for initiating the capillary effect, the filling of the intermediate space can be facilitated at least initially by a force that acts on the adhesive. Such a force is already the force of the weight of the adhesive or a centrifugal force as a consequence of a rotational motion. Moreover, the pressure differentials on both sides of the adhesive can be used. In addition, other measures that use mechanisms other than a force effect for improving the capillary flow can be exploited in order to facilitate the complete and void-free filling of the intermediate space.

As a consequence of the exact dimensions of the recess and, thus, the amount of adhesive in combination with the use of the capillary effect, the adhesive can be prevented from flowing into the pressure sensor. As a result, it is possible not to produce the adhesive film until at a later stage of the manufacture of the pressure sensor—for example, when the pressure-sensing element is already mounted in the pressure sensor and the interior of the pressure sensor is sealed at least partially.

In one embodiment of the pressure sensor the adhesive film terminates, when viewed from the side of the recess, in a meniscus, and said meniscus borders on an edge, which is formed by an offset in the surface structure of the pressure port or by one of the other components to be connected to the pressure port. Such an edge can be configured in a surface in a number of ways—for example, by means of a groove, a notch, a step or the like. Said edge can cause the adhesive substance to stop flowing and, thus, to define the formation of the meniscus. As a consequence, it is possible to include the volume of the meniscus with enough precision in the dimensioning of the recess.

The recess can be filled with both liquid adhesive—for example, by means of a dispensing mechanism—or in the superficially dry state with a liquefaction at a later time. The dispensing mechanism and the adhesive substance that is appropriate for said dispensing mechanism have been tested in the fabrication of semiconductors and allow a very accurate proportioning and dispensing of the adhesive. Owing to the processing of liquid adhesive, it is necessary for the dispensing mechanism to have positioned in relation to each other the two components that are to be connected, before the recess is filled with the adhesive substance. As an alternative, the so-called B-stage adhesives make it possible, owing to their temporarily dry surface, to prefabricate individual components having an already filled recess, so that the adhesive can already be applied in the recess before the positioning takes place.

For this reason and on the basis of the above-described design options for the recess, the individual process steps, described in the method claims, are not fixed in their order of sequence. Rather, in particular, the filling of the recess with adhesive, the positioning of the components in relation to each other or the mounting of the pressure-sensing element on the pressure port can take place at different times.

In order to guarantee that the intermediate space is completely filled with adhesive by the capillary effect and, thus, to produce the necessary thickness of the adhesive film, it is necessary to position the components precisely in relation to each other—for example, the pressure port and the housing and, therefore, the surfaces that are to be adhesively cemented together. In one embodiment it is possible to adjust the distance in a simple and reliable way by means of spacers, which are positioned between the surfaces.

As an alternative, it is also possible, based on the necessary small distance, to use those fit tolerances of the clearance fits that are to be maintained in general for the individual meshing components. The sum total of these fit tolerances, also called tolerance zones, in a module, which is assembled of multiple components, results in such a clearance that the width is appropriate for forming an above-described intermediate space.

Therefore, in one embodiment the width of the intermediate space between the housing and the pressure port and, thus, the thickness of the adhesive film between the two is equal to the sum of the fit tolerances—that is, the clearance of the components of the pressure sensor that are already mounted together until the intermediate space is filled with an adhesive substance. To this end the kind and the order of sequence of the assembly of the individual components and the filling of the intermediate space with an adhesive substance must be harmonized, as described below by means of an embodiment, in such a way that the mandatory gap between the pressure port and the housing remains.

According to additional embodiments of the pressure sensor, at least those sections of the surface of the described components of the pressure sensor, with which a pressure-loaded cemented joint is to be produced, exhibit special surface properties, in order to achieve the necessary adhesive strength of the adhesive surfaces with the adhesive substance. Besides the cemented joint of the pressure sensing element or a base for the pressure-sensing element, the connection between the pressure port and the housing is also under tensile force or shear force due to the influence of the pressure.

The surface sections under discussion exhibit a defined roughness and are covered with an adhesive bonding coat, where an adhesive bonding coat is characterized in that it conforms to and, thus, maps in a barely changed manner the surface structure, located below said adhesive bonding coat.

The necessary roughness is produced with a suitable blasting process by using a variety of blasting materials and by setting the exposure time. The purpose of these two parameters is to produce diffuse surface structures that may differ with respect to both their structures and their roughness parameters.

Diffuse roughness is defined here as a surface profile without regularly recurring structures, such as those that can be found after machining operations, embossing of a texture or the like.

The surface characteristics with respect to roughness and surface compression as a consequence of the blasting process are to be optimized, inter alia, for the respective application as a function of the adhesive that is used and the possible dimensions and structure of the respective adhesive area. Even the structure of the surface that is to be produced by means of the blasting process can be varied, inter alia, by means of the blasting material that is used. Thus, a spherical blasting material is used to achieve a surface profile that exhibits rounded off edges and depressions and shows a significantly enhanced adherence. Finally the blasting process itself depends on the material of the component to be blasted. Owing to these optimization options, during the treatment of a plurality of surfaces on one component these surfaces may also exhibit diverging characteristics.

The adhesive bonding coat can be produced by means of a suitable method, which depends on the material of the component to be provided with the adhesive bonding coat. For example, the adhesive bonding coat can be configured as the passivation layer of the material of the component. Hence, the adhesion-promoting properties during a total passivation of, for example, the pressure port may take place in the event that said pressure port is used in an aggressive environment, so that the adhesive bonding coat serves in those regions that are not covered with the adhesive as the corrosion protection, in particular, against the applied medium. It is possible to produce the passivation layers with good conformity. The term conformity of a layer describes here a homogeneous layer thickness, independent of the horizontal, vertical or angular orientation, and independent of the structure of the coated surface section.

In one embodiment it is also possible to produce the adhesive bonding coat section by section or in a different way section by section by means, for example, of a suitable masking process.

Owing to the use of passivation layers as the adhesive bonding coat, an additional embodiment can comprise such an adhesive bonding coat that does not contain any chromium (VI)-containing components, because the production of the passivation layer allows the use of chromium (VI)-free or chromium (III)-containing bath material. Therefore, the requirements especially in the electrical and automotive industry, according to which no chromium (VI)-containing compounds shall be used, are met.

Since both the capillary effect for filling the intermediate space and also the adherence of the adhesive on the surface to be bonded, are subject to the influence of the molecular forces between the adhesive and the surface as well as the bonding and energetic conditions, which are reflected, inter alia, in the wetting power of the surface, and since, in particular, an energetic evaluation of a surface with respect to its adhering power is possible only with extreme difficulty, the result is the use of an adhesive bonding coat, the kind and production of which is usually produced by means of an optimization process.

The optimization process with respect to the capillary effect alone or in conjunction with an adhesive bonding coat is based, inter alia, on the material of the surface to be adhesively cemented, on the adhesive, and on the thermal, chemical and mechanical loads on the cemented joint and similarly also on the above-described possible sequence of the process for producing the cemented joint. Usually a conforming passivation layer is produced. The term conformity of a layer describes here a homogeneous layer thickness, independent of the horizontal, vertical or angular orientation, and independent of the structure of the coated surface section. Furthermore, in the case of metals and similarly also synthetic plastic materials, plasma treatments are suitable for changing the bonding properties of a surface layer of the material in such a manner that the adhesion may be enhanced. In fact, the adhesive bonding coat is necessary only in the region to be bonded, but can also be produced just as well on the entire surface of the component.

Another embodiment uses for the pressure port or at least for parts of the housing such materials that are lead free. In this way the statutory requirement stipulating the use of lead-free materials can be satisfied. Nevertheless, the described possibilities for improving the adhesive structure and the bonding properties allow the pressure sensors to be produced with the desired reliability in the aforementioned pressure and temperature range.

BRIEF DESCRIPTION OF THE DRAWING FIGURES

The pressure sensor of the invention shall be explained in detail below with reference to a few embodiments. The related FIG. 1 is a schematic rendering of a vertical view of a pressure sensor;

DETAILED DESCRIPTION

Figure 1:
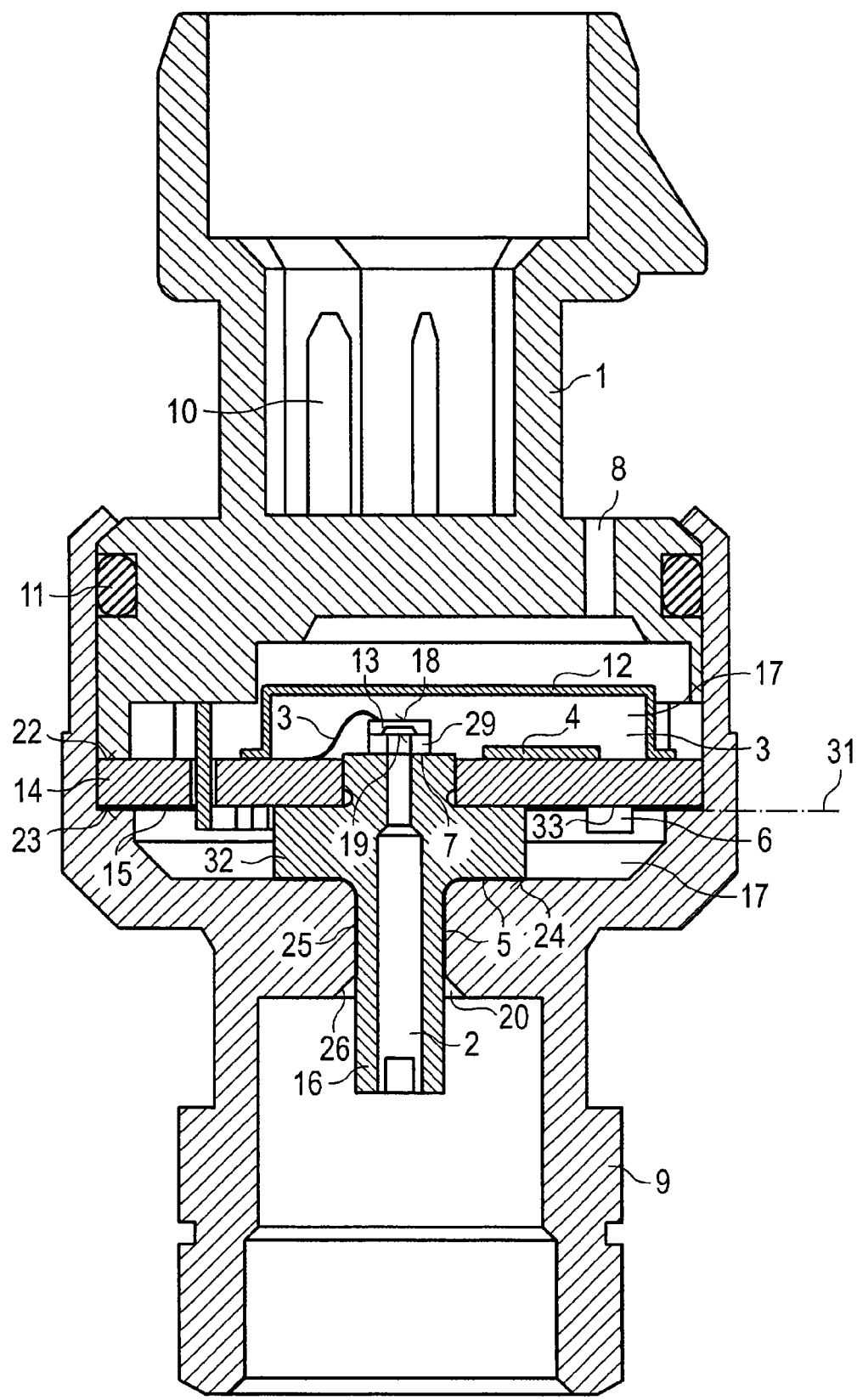

The pressure sensor, according to FIG. 1, consists of a housing 9 and a housing plug 1, both of which are connected together in a sealing and detachable manner. The tightness of the connection with respect to dust and moisture is produced by means of a sealing ring 11, which envelops the housing plug 1 and rests against the housing 9.

The housing 9 and the housing plug 1 envelop a cavity, into which a pressure port 16 projects. Both the pressure port 16 and the housing 9 and housing plug 1 can be made of a lead free material.

The housing plug 1, which is not exposed to the pressure medium, is made of a synthetic plastic material; and the two former components are made of a lead-free aluminum alloy. As an alternative, other materials can also be used in this case—for example, brass, a synthetic plastic material or stainless steel—that exhibit a mechanical and chemical stability in many applications. Both components may also be made of materials that diverge from each other.

The pressure port 16 exhibits a passage 2, which empties into the cavity 17 and is sealed with a pressure-sensing element 13 in said cavity. The pressure-sensing element 13 is a micro-mechanical component and semiconductor-based. In the present embodiment said pressure sensing element is a piezo-resistive silicon pressure-sensing element 13, which exhibits a glass base 29 on its backside. The base 29 also has a passage. This passage empties into a diaphragm of the pressure-sensing element 13. The pressure sensing element 13 is mounted on the pressure port 16 in such a manner with the intercalation of the base 29 that the passage of the base 29 corresponds with the passage 2 of the pressure port 16. Thus, a medium, applied in the pressure port 16, acts on the backside 19 of the pressure-sensing element 13. As an alternative, the pressure sensor can also be produced with another suitable pressure sensing element 13; or it can be mounted directly on the pressure port 16 without a base 29 or mounted on the pressure port with another base.

The pressure port 16 exhibits in its upper region a flange 32 and is connected to the housing 9 with the flange 32 by means of an adhesive film 5. In one embodiment of the pressure sensor the pressure-sensing element 13 is mounted on the pressure port 16 by means of an additional adhesive film 7. As an alternative this connection can also be produced with additional means—for example, by means of suitable holding elements.

Moreover, the pressure sensor, shown in FIG. 1, exhibits a circuit carrier 14, which is also adhesively cemented on the pressure port 16—in the embodiment on its flange 32. The circuit carrier 14 is mounted on the pressure port 16 in such a manner that a reliable electrical connection can be produced between the measurement resistors (not illustrated) of the pressure sensing element 13 and the circuit elements of the circuit carrier 14 by means of flexible connectors 3, for example, wire bridges. In order to condition the signals, which are sampled by the measurement resistors, one embodiment of the pressure sensor provides that the circuit carrier 14 exhibits on its side facing the pressure sensing element 13 suitable integrated circuits (ICs) 4. The mounting of the circuit carrier 14 on the pressure port 16 positions it in a defined position in relation to the pressure-sensing element 13, thus removing the mechanical stress from the flexible electrical connection between the two. In alternative embodiments, the circuit carrier 14 may also be mounted on the housing 9 or on the housing plug 1, insofar as thermal or pressure induced relative movements between the circuit carrier 14 and the pressure sensing element 13 can be compensated by the electrical connection.

On the side facing away from the pressure-sensing element 13, the circuit carrier 14 may exhibit SMD components 6, which implement additional functions of the pressure sensor. For example, they may be used to measure the temperature in the cavity 17 of the pressure sensor, in order to assess and compensate the temperature effects on the measurement electronics.

In another embodiment the pressure sensing element 13 and at least parts of the circuit carrier 14, on which the ICs 4 are mounted, including the flexible electrical connectors 3 between the two, are covered by a cap 12. This cap 12 may be mounted in a sealing manner on the circuit carrier 14 or, as an alternative, on the pressure port 16, so that a defined reference pressure, surrounding the pressure-sensing element 13, can be produced in the cap. However, said cap may also be used merely as a mechanical protection for the pressure sensing element 13 and optionally the ICs 4, so that in this case a simple fastening of the cap 12 relative to the components suffices. As an alternative, the cap 12 may also be mounted in a pressure-tight manner and may exhibit pressure-compensating orifices, so that a reference pressure or the ambient pressure can be produced by choice in the cap 12. With such a modification or with a comparable modification, the pressure sensor can be used as both a differential pressure sensor and as a relative pressure sensor as well as an absolute pressure sensor. The ambient pressure acts on the front side 18 of the pressure-sensing element 13 by way of an orifice 8 in the housing plug 1 and an open pressure-compensating orifice (not illustrated) in the cap 12, so that a relative pressure between the pressure, applied in the pressure port 16, and the ambient pressure can be measured. Similarly a defined pressure can be applied in the housing plug 1 and the cap 12 by way of the orifice 8, so that the differential pressure can be measured. If, in contrast, a reference pressure is set in the interior of the pressure sensor by means of the pressure-tight cap 12, then the absolute pressure can be measured.

In order to protect against ambient conditions, the pressure-sensing element 13 may be covered alone or in connection with an IC 4 by means of a protective layer. This measure is possible as an addition or alternative to the arrangement of a cap 12.

In one embodiment of the pressure sensor the housing plug 1, which covers the pressure sensing element 13 and the circuit carrier as well as, if desired, the cap 12, is made of a synthetic plastic material and is fitted with exterior, injected molded contacts 10 for the electrical connection of the electronic components in the interior of the pressure sensor.

In order to produce the adhesive film 5 between the pressure port 16 and the housing 9, the embodiment in FIG. 1 provides that a defined distance between both components is produced. Said distance is in the magnitude of 50 to 150 μm. This distance, which is short in comparison to the dimensions of the pressure sensor, can be set by the cumulative fit tolerances of the components of the pressure sensor that define the position of the pressure port 16.

Figure 3:
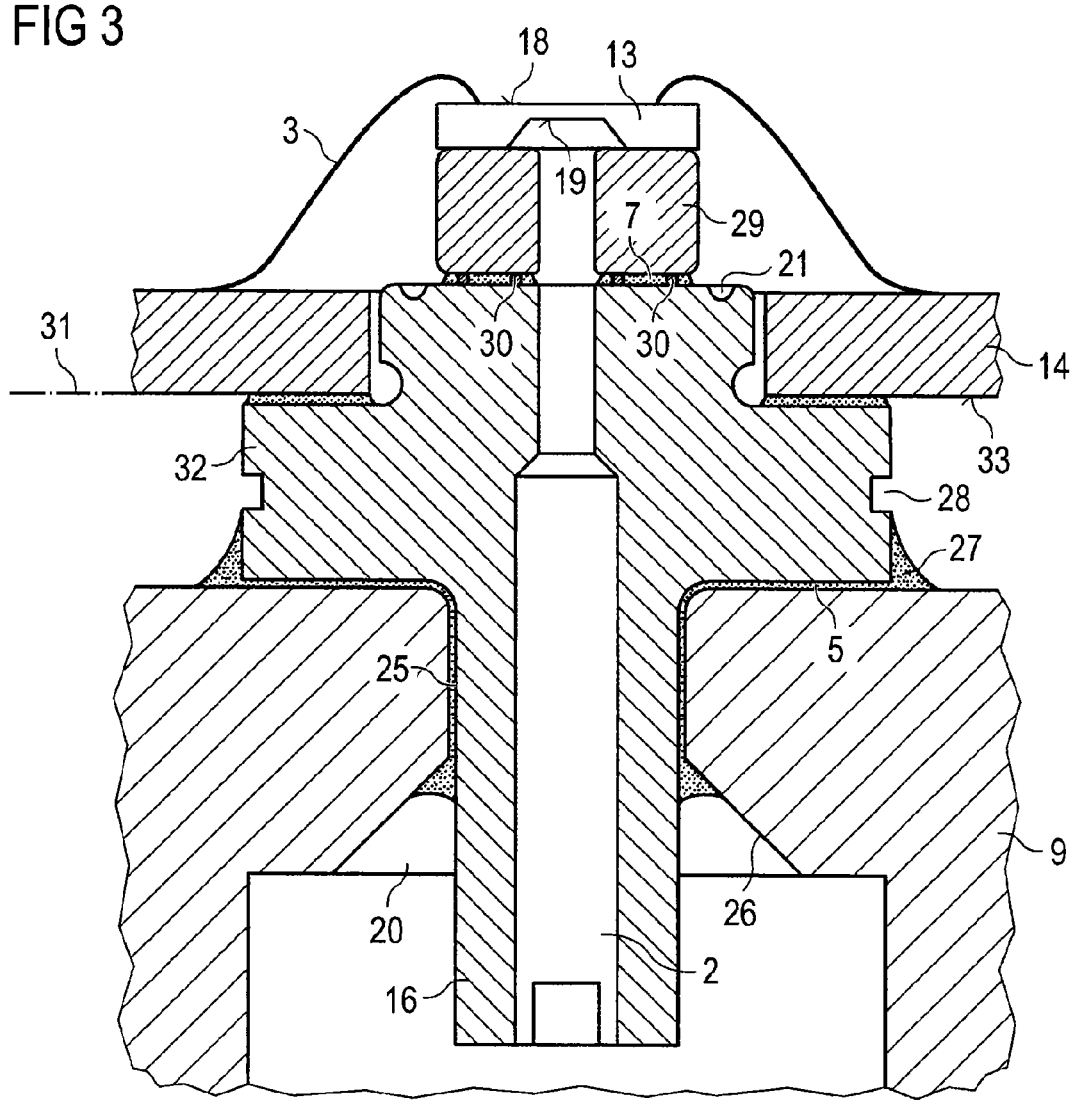
FIG. 3 is another enlarged drawing of a pressure port with a pressure-sensing element that is adhesively cemented on the pressure port by means of an additional cemented joint.

In order to determine the fit tolerances that are to be considered, a reference plane 31 can be determined. This reference plane represents a fixed reference plane in relation to the position of the pressure port 16 while filling the recess 20 with adhesive or during premature filling of the recess 20, for the purpose of initializing the capillary flow. In FIG. 1, the recess 20 is located on the bottom region of the pressure port 16, so that in the case of a pressure sensor that is otherwise mounted in its entirety, the recess 20 will be filled through the bottom orifice in the housing 9 when the pressure sensor is rotated by 180° (in the drawing plane). In this position the underside 33 of the circuit carrier 14 is suitable as the reference plane 31, because the position of the pressure port 16 in relation to this reference plane 31 is also defined by means of the defined position of the circuit carrier 14 between the housing 9 and the housing plug 1 and the attachment of the pressure port 16 with the circuit carrier 14, for example, by means of a cemented joint (FIG. 3). Consequently the intermediate space between those surface sections of the pressure port 16 and the housing 9 that are to be adhesively cemented together is derived from the accumulation of the fit tolerances of the flange 32 of the pressure port 16 below the circuit carrier 14, including its connection to the circuit carrier 14, in proportion to the fit tolerances of the housing 9 from the reference plane 31 up to the bottom area 24 of the cavity 17. Other reference planes are just as possible—for example, the upper side of the circuit carrier 14 or the upper or the lower mounting surface 22, 23 in the housing plug 1 and/or in the housing 9 or others.

The mounting of the above-described pressure sensor exhibits in general the following process steps:

positioning the pressure port 16 in the housing 9 in such a manner that one section of the surfaces of the pressure port 16 and one section of the surfaces of the housing 9 respectively lie opposite each other with a defined intermediate space; and a recess 20, which is configured in the pressure port 16 or in the housing 9 or in both together (the volume of said recess being equal to the volume of the adhesive film 5), borders on the intermediate space, wherein the distance between the surfaces of the pressure port 16 and the housing 9 is set so short that the intermediate space acts as the capillary, based on the material of the adhesive film 5 in its liquid state, total filling of the recess 20 with an adhesive, filling the intermediate space with the adhesive while using the capillary effect of the intermediate space, curing the adhesive, and mounting the pressure-sensing element on the pressure port 16 in such a manner that a passage 2, located in the pressure port 16, is sealed on one side.

In this case the sequence of order of these process steps that are described in general terms can vary as a function of the different structural requirements—for example, the configuration of the housing or as a function of the employed adhesive and its manner of application in the recess.

In order to mount the pressure sensor, according to the above-described embodiment, the first step is to mount the pressure-sensing element 13 with the glass base on the pressure port 16. Then a circuit carrier 14, usually a printed circuit board with an IC 4, is also mounted on the pressure port 16, so that the printed circuit board surrounds the pressure-sensing element 13. Both mountings are done by means of adhesive cementing. The pressure-sensing element 13 is connected electrically to the circuit carrier 14 and to the IC 4 by means of flexible connectors 3, in the present case the wire bridges. Then the pressure sensing element 13 and the IC 4 are covered by a cap 12, which is also mounted on the circuit carrier 14 by means of adhesive cementing.

The circuit carrier 14 and with it the pressure port 16 as well as the pressure sensing element 13 are configured in the housing on a bottom mounting surface 23, which is designed in the pressure port 16, in such a manner that the pressure port 16 projects through an orifice 25 in the housing 9. Then the pressure sensor is sealed by inserting the housing plug 1 into the housing 9. Owing to the above-described fit tolerances, the result is a clearance between the flange 32 of the pressure port 16 and the bottom area 24 of the cavity 17. In the case of the above-described position of the pressure sensor that is rotated by 180° in the drawing plane, during the production process, this clearance remains as the intermediate space between the two surfaces of the pressure port 16 and the housing 9 that are to be adhesively cemented together. Even that part of the pressure port 16 that projects through the orifice 25 of the housing 9 exhibits a clearance to the orifice diameter so that in this case, too, the result is an intermediate space that is adjacent to the former clearance. Owing to the suitable design of the pressure port 16 and the housing 9 in those sections of the surface that are to be adhesively cemented together, the capillary flow is not interrupted even on the edges and the transitions.

Outside of the pressure sensor and surrounding that part of the pressure port 16 that projects from the housing 9, the orifice 25 of the housing 9 exhibits a phase 26, which is dimensioned exactly so large that the volume of a recess 20, which is produced thereby in the housing in the direction of the pressure port, is equal to the total volume of the two above-described intermediate spaces.

In a next step of the process a liquid adhesive is introduced into the recess 20 by means of a dispensing mechanism—that is, a proportioned and positioned application of the adhesive substance—by means of a channel. Owing to the accurate filling of the recess 20, the exact amount of adhesive that is necessary for filling the described intermediate spaces is applied. As a result of the width of the intermediate spaces, the liquid adhesive is drawn into the intermediate spaces and, after the adhesive has cured, forms the adhesive film 5 between the pressure port 16 and the housing 9.

Figure 2:
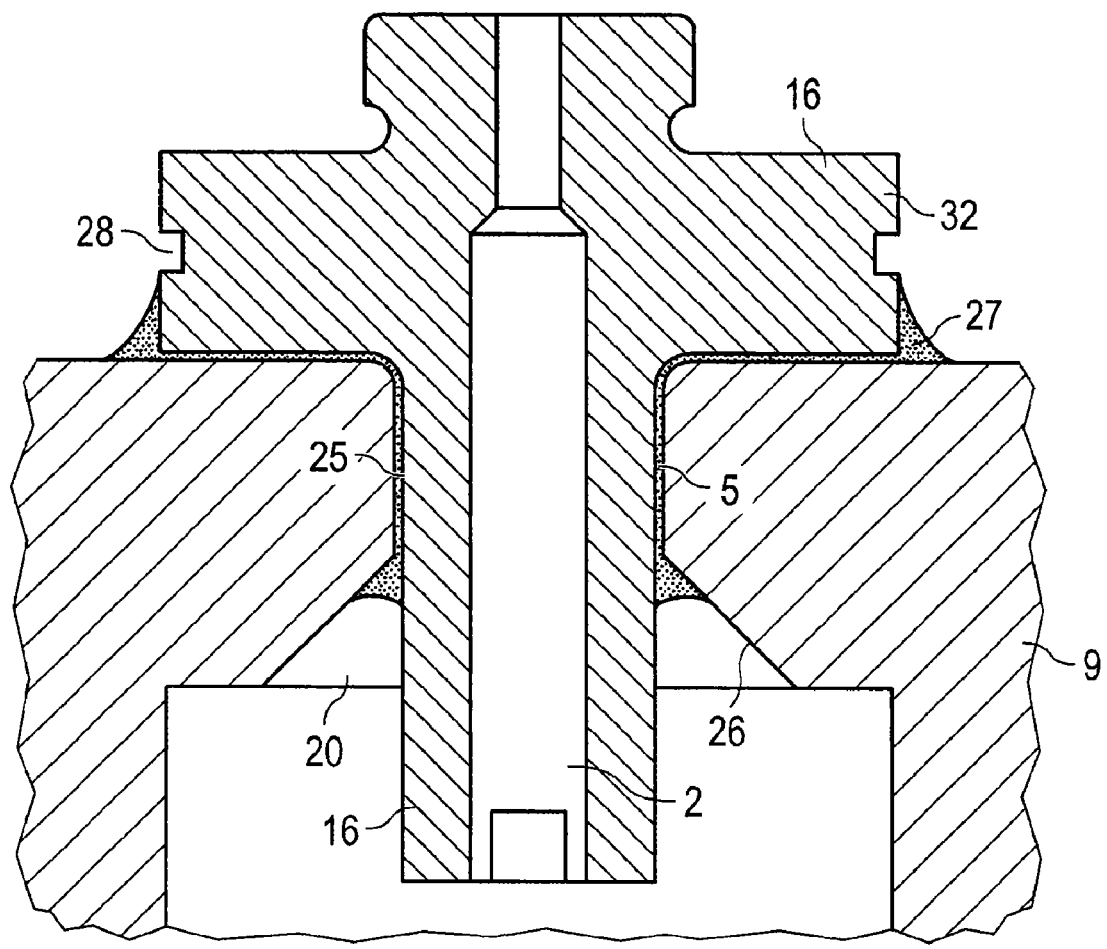
FIG. 2 is an enlarged drawing of the pressure port in FIG. 1.

Owing to a wetting power (produced by the choice of materials) of the surface of the pressure port 16 with the adhesive, a meniscus 27 forms on that limiting boundary of the adhesive film 5 that is located opposite the recess 20 (FIG. 2). This meniscus 27 is bounded by a groove 28, which is cut into the pressure port 16 at the corresponding position. The position of the groove is defined by the size of the meniscus 27 in relation to the amount of the applied adhesive and by the distance to the adjacent components. FIG. 2 is an enlarged view of the pressure port 16 with the adhesive film 5, including the meniscus 27, in relation to the adjacent sections of the housing 9. For a better overview, the other adjacent components are not shown in detail.

In contrast, FIG. 3 shows an enlarged drawing of the pressure port 16, mounted in the housing 9, from FIG. 1 with the mounted pressure sensing element 13 and the circuit carrier 14. The pressure port 16 is mounted in the housing 9 as described above, after the pressure port 16 is adhesively cemented on the circuit carrier 14; and the pressure sensing element 13 is adhesively cemented on the pressure port. An additional cemented joint, which is comparable in its structure and design to the above-described cemented joint, can be produced between the pressure port 16 and the pressure-sensing element 13 or in a comparable manner also between two other components by means of an additional adhesive film.

The additional adhesive film 7 between the pressure port 16 and the pressure sensing element 13, which comprises here on its backside 19 a base 29, which is made of silicon-containing material, is produced in a manner comparable to that described for the adhesive film 5 between the pressure port 16 and the housing 9. In this case, too, the amount of adhesive substance, which will form the additional adhesive film 7, is defined by a recess 20, which is totally filled with liquid adhesive. Adjacent to the recess 20 on the upper termination of the pressure port 16, on which the pressure sensing element 13 is to be adhesively cemented, is an intermediate space, which is set by means of the spacer 30 between the base 29 of the pressure sensing element 13 and the pressure port 16. The width of the distance is selected in turn so small that the intermediate space can be filled with the use of the capillary effect. After the adhesive material has cured, the additional adhesive film 7 is produced.

In order to enhance the adhesive strength of the cemented joints and simultaneously the capillary effect, an additional embodiment provides that as an alternative or in addition to the pressure sensing element 13 or the housing 9, those sections of the surface of the pressure port 16 that rest against at least one of the adhesive films 5, 7 are provided with a surface roughness, which was produced by means of a pressure blasting process, during which spherical blasting material—for example, beads made of glass, ceramic or the like—is used. The surface, which is treated in this manner, exhibits a crater-shaped and diffuse roughness in the respective regions. This roughness does not include peaks, but rather only rounded off edges and depressions.

Furthermore, the pressure port 16 and/or one of the additional components and, thus, those sections of the surface of the pressure port that are treated in this manner are coated with a passivation layer. A passivation layer having the aforementioned properties is achieved by means of optimized process parameters, such as the bath residence time, bath concentration, bath temperature or the pH value, with the use of chromium (VI)-free or chromium (III)-containing bath material. In connection with the surface roughness, the passivation layer guarantees an enhanced wetting of the surfaces that are to be adhesively cemented. The good wetting power leads to the desired reliability of the cemented joint between the pressure port 16 and the housing 9 and, if desired, the pressure sensing element 13 both by way of the influence on the capillary effect as well as on the improved adherence of the adhesive on the surface.

The invention claimed is:

1. Pressure sensor, comprising a housing; a pressure port, projecting into the housing; and a pressure sensing element arranged on the pressure port in such a manner that a passage, located in the pressure port, is sealed on one side, wherein the housing and the pressure port are connected together by an adhesive film, and a distance between sections of a surface of the pressure port and of the housing, with which the port and housing are connected together by the adhesive film, is set so small that an unfilled intermediate space acts as a capillary, based on material of the adhesive film in it's a liquid state; and the pressure port or the housing or both exhibit a recess in a region, which borders at least section by section on the adhesive film, the volume of said recess being equal to a volume of the adhesive film.

2. Pressure sensor, as claimed in claim 1, wherein the pressure port or the housing or both exhibit an edge of an offset along a limiting boundary of the adhesive film, which does not border on the recess; and the adhesive film comprises a meniscus, which terminates on said edge.

3. Pressure sensor, as claimed in claim 1, wherein the thickness of the adhesive film is equal to sum of fit tolerances of the pressure port and of components of the pressure sensor that define position of the pressure port in the mounted pressure sensor.

4. Pressure sensor, as claimed in 1, wherein the thickness of the adhesive film is defined by spacers that are arranged between the pressure port and the housing.

5. Pressure sensor, as claimed in claim 1, wherein the pressure port or the housing or both exhibit a surface roughness in a region, which is covered by the adhesive film, and is provided with an adhesive bonding coat.

6. Pressure sensor, as claimed in claim 1, wherein the pressure sensor exhibits an additional cemented joint of the pressure port with an additional component of the pressure sensor by an additional adhesive film, and at least the pressure port exhibits an additional recess in a region, which borders at least section by section on said additional adhesive film, volume of said additional recess being equal to volume of the additional adhesive film.

7. Method, for producing a pressure sensor, comprising a housing; a pressure port, which projects into the housing and which is connected to the housing by an adhesive film; as well as a pressure sensing element; and which comprises the following process steps:
   positioning the pressure port in the housing in such a manner that one section of surfaces of the pressure port and one section of surfaces of the housing respectively lie opposite each other with a defined intermediate space; and a recess, which is configured in the pressure port or in the housing or in both together borders on the intermediate space, volume of said recess being equal to the volume of the adhesive film,
   wherein distance between the surfaces of the pressure port and the housing is set so short that the intermediate space acts as a capillary, based on material of the adhesive film in it's a liquid state,
   total filling of the recess with an adhesive,
   filling the intermediate space with the adhesive while using the capillary effect of the intermediate space,
   curing the adhesive, and
   mounting the pressure-sensing element on the pressure port in such a manner that a passage, located in the pressure port, is sealed on one side.

8. Method for producing a pressure sensor, as claimed in claim 7, wherein the recess is filled by a dispensing mechanism.

9. Method for producing a pressure sensor, as claimed in claim 7, wherein the adhesive film is configured with a meniscus; and the meniscus terminates on an edge of an offset, which the pressure port or the housing or both exhibit along a limiting boundary of the adhesive film that does not border on the recess.

10. Method for producing a pressure sensor, as claimed in claim 7, wherein the pressure port is positioned in the housing by additional components of the pressure sensor, said additional components defining the position of the pressure port in the mounted pressure sensor; and the distance between the surfaces of the pressure port and of the housing is set by the accumulation of fit tolerances of the pressure port and said additional components.

11. Method for producing a pressure sensor, as claimed in claim 7, wherein the distance between the surfaces of the pressure port and of the housing is set by spacers.

12. Method for producing a pressure sensor, as claimed in claim 7, wherein a surface roughness is produced by a blasting process on both or one of the sections of the surfaces of the pressure port and the housing that are connected together by the adhesive film.

13. Method for producing a pressure sensor, as claimed in claim 7, wherein a conforming adhesive bonding coat is produced on both or one of the sections of the surfaces of the pressure port and the housing that are connected together by the adhesive film.

14. Method for producing a pressure sensor, as claimed in claim 7,
   wherein an additional cemented joint is produced by an additional adhesive film between the pressure port and an additional component of the pressure sensor, and which comprises the following process steps:
      positioning the additional component in relation to the pressure port in such a manner that one section of the surfaces of the pressure port and of the additional component respectively lie opposite each other with a defined second intermediate space, and an additional recess, which is configured at least in the pressure port, the volume of said recess being equal to the volume of the additional adhesive film, borders on the intermediate space,
   wherein distance between the surfaces of the pressure port and the additional component is set in such a manner that the second intermediate space acts as a capillary, based on material of the additional adhesive film in it's a liquid state,
   total filling of the additional recess with an adhesive,
   filling the second intermediate space with the adhesive while using the capillary effect of the second intermediate space, and
   curing the adhesive.

* * * * *